(12) United States Patent
Duranton et al.

(10) Patent No.: US 11,017,290 B2
(45) Date of Patent: May 25, 2021

(54) SIGNAL PROCESSING MODULE, ESPECIALLY FOR A NEURAL NETWORK AND A NEURONAL CIRCUIT

(71) Applicant: COMMISSARIAT A L'ENERGIE ATOMIQUE ET AUX ENERGIES ALTERNATIVES, Paris (FR)

(72) Inventors: Marc Duranton, Orsay (FR); Jean-Marc Philippe, Gif-sur-Yvette (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 784 days.

(21) Appl. No.: 15/037,659

(22) PCT Filed: Nov. 27, 2014

(86) PCT No.: PCT/EP2014/075729
§ 371 (c)(1),
(2) Date: May 18, 2016

(87) PCT Pub. No.: WO2015/090885
PCT Pub. Date: Jun. 25, 2015

(65) Prior Publication Data
US 2016/0292566 A1    Oct. 6, 2016

(30) Foreign Application Priority Data

Dec. 18, 2013 (FR) ...................................... 1362859

(51) Int. Cl.
*G06N 3/063* (2006.01)
*G06K 9/00* (2006.01)
(Continued)

(52) U.S. Cl.
CPC ............ *G06N 3/063* (2013.01); *G06F 12/02* (2013.01); *G06F 12/0223* (2013.01);
(Continued)

(58) Field of Classification Search
CPC ....................................................... G06N 3/063
See application file for complete search history.

(56) References Cited

U.S. PATENT DOCUMENTS 5,014,235 A * 5/1991 Morton ................... G06F 5/015
708/520
5,023,833 A 6/1991 Baum et al.
(Continued)

FOREIGN PATENT DOCUMENTS

| EP | 0 558 125 A1 | 9/1993 |
| EP | 0 694 856 A1 | 1/1996 |
| WO | 91/19259 A1 | 12/1991 |

OTHER PUBLICATIONS

Kalte et al. (Context Saving and Restoring for Multitasking in Reconfigurable Systems, Aug. 2005, pp. 223-228) (Year: 2005).*

*Primary Examiner* — George Giroux
(74) *Attorney, Agent, or Firm* — BakerHostetler

(57) ABSTRACT

A signal processing module comprises at least one operational unit incorporating computation units, input and output interfaces able to be linked to a bus and a memory storing data destined for the computation units, the memory being organized so that each data word is stored column-wise over several addresses according to an order dependent on the application, a column having a width of one bit, the words being transferred in series to the computation units.

19 Claims, 4 Drawing Sheets

(51) Int. Cl.
  *G06F 12/02* (2006.01)
  *G06N 3/04* (2006.01)
  *G11C 11/54* (2006.01)

(52) U.S. Cl.
  CPC ........... *G06K 9/00986* (2013.01); *G06N 3/04* (2013.01); *G11C 11/54* (2013.01); *Y02D 10/00* (2018.01)

(56) References Cited

U.S. PATENT DOCUMENTS

| | | | |
|---|---|---|---|
| 5,063,521 A | 11/1991 | Peterson et al. | |
| 5,129,092 A * | 7/1992 | Wilson | G06F 9/3885 382/304 |
| 5,469,003 A * | 11/1995 | Kean | H03K 19/17756 326/39 |
| 5,557,734 A * | 9/1996 | Wilson | G06T 1/20 345/505 |
| 5,572,689 A * | 11/1996 | Gallup | G06N 3/063 712/200 |
| 5,640,586 A * | 6/1997 | Pechanek | G06F 15/8023 712/13 |
| 5,978,303 A * | 11/1999 | Takasugi | G11C 7/1018 365/230.03 |
| 7,082,419 B1 * | 7/2006 | Lightowler | G06N 3/063 706/15 |
| 2003/0023805 A1 * | 1/2003 | Fujisaki | G11C 8/10 711/5 |
| 2004/0216006 A1 * | 10/2004 | Kim | G11C 29/18 714/30 |
| 2005/0066213 A1 * | 3/2005 | Vorbach | G06F 1/3203 713/500 |
| 2007/0126474 A1 * | 6/2007 | Chang | H04L 49/101 326/38 |
| 2007/0283125 A1 * | 12/2007 | Manczak | G06F 11/3466 711/207 |
| 2014/0365548 A1 * | 12/2014 | Mortensen | G06F 9/3001 708/523 |

* cited by examiner

SIGNAL PROCESSING MODULE, ESPECIALLY FOR A NEURAL NETWORK AND A NEURONAL CIRCUIT

CROSS-REFERENCE TO RELATED APPLICATIONS

This application is a National Stage of International patent application PCT/EP2014/075729, filed on Nov. 27, 2014, which claims priority to foreign French patent application No. FR 1362859, filed on Dec. 18, 2013, the disclosures of which are incorporated by reference in their entirety.

FIELD OF THE INVENTION

The present invention relates to a signal processing module, in particular able to implement algorithms of neural network type. The invention also relates to a neuronal circuit. It applies in particular in respect of the implementation of neural networks on silicon for the processing of diverse signals, including multidimensional signals such as images for example. It also allows the efficient realization of conventional signal processing methods.

BACKGROUND

Neural networks are already much used and can potentially be used in very many applications, in particular in all devices, systems or procedures calling upon learning approaches or mechanisms serving to define the function to be carried out, in contradistinction to the more traditional approaches in which the actions to be performed are defined in an explicit manner by a "program". A multitude of systems, ranging from the most sophisticated technical or scientific areas to the areas of everyday life, are thus concerned. All these applications demand ever higher performance in particular in terms of computation power to carry out ever more complex functions, of adaptability, of size and of energy consumption. The algorithms implemented are essential in achieving such performance. The hardware architecture making it possible to implement these algorithms must also be taken into account in the achievement of performance, in particular at a time when the rise in frequency of processors is stagnating or at least seems to have reached its limits.

To a first approximation, neuronal hardware architectures can be classed according to two aspects:
  A first aspect relates to their structure, the latter possibly being digital or analog, or indeed hybrid;
  A second aspect relates to their specialization in relation to the neural networks liable to be implemented, the architectures possibly being specialized in a few well defined neural networks, such as RBF (Radial-Basis Function) or Kohonen map, or possibly being generic, in particular programmable so as to allow the implementation of a greater variety of networks.

The types of system addressed by the present patent application are related to generic circuits, with digital implementation.

The hardware architectures of neuronal systems generally comprise elementary base modules able to implement a set of neurons. In a known manner, a neuron of order i in a neuronal system carries out a function of the type:

$$R_i = f\left(\sum_j w_{ij} E_j\right)$$

$w_{ij}$ and $E_j$ being respectively the synaptic weights associated with the neuron and its inputs. The elementary module comprises in particular the arithmetic and logic units (ALU) making it possible to carry out all these neuronal functions. F is generally a nonlinear function.

A technical problem to be solved is in particular that of making efficient use of the silicon on which the neural networks are implanted, especially that of allowing optimal use of the storage of the weights and other data in the internal memory of the hardware architecture. Another problem is in particular that of allowing a hardware realization that can be expanded as regards the number of neurons/synapses (and therefore of inputs).

SUMMARY OF THE INVENTION

An aim of the invention is in particular to alleviate the aforementioned drawbacks, for this purpose the subject of the invention is a signal processing module, comprising at least one operational unit incorporating computation units, input and output interfaces able to be linked to a bus and a memory storing data destined for said computation units, said memory being organized in such a way that each data word is stored column-wise over several addresses, a column having a width of one bit, the words being transferred in series to said computation units.

In a possible embodiment, each data word is stored column-wise over several addresses according to an order dependent on the application using said data, this set of several addresses comprises for example address jumps.

The data transfers are for example performed according to one column per computation unit.

In a possible embodiment, the module comprises a routing unit connected between said memory and the operational unit, said routing unit having a number of inputs at least equal to the number of width bits of said memory, each input being linked to a single column only, said routing unit routing the data words from said memory to the computation units, one and the same word being able to be routed to several computation units.

The routing unit comprises for example at least two other series of inputs/outputs able to be linked to circuits outside said module.

These inputs/outputs are for example able to be linked as inputs and outputs of the routing unit of another module identical to said module.

The routing unit performs for example all or part of the following operations:
  shifting of the bits of the data words;
  logical operations;
  expansion of the words.

The module comprises for example a memory virtualization unit linked on the one hand in write and read mode to said memory and on the other hand to an external memory via a circuit of DMA type.

The memory virtualization unit performs for example operations of reorganization of said memory.

The operations of reorganization of said memory are for example done by duplication or change of order of the data between the columns of said memory.

The input and output interfaces communicate for example with said bus by a TDMA protocol.

Said memory allows for example independent accesses in read and write mode for the input interfaces, the virtualization unit and the routing unit.

Advantageously, the module operates for example according to several independent synchronous zones, the operational unit operating in a first clock area, the input interface and the output interface operating in a second clock area.

The memory virtualization unit operates for example in a third independent clock area.

The computation units execute for example the operations as a function of the value of a guard bit assigned to each of said units.

The operational unit comprises for example at least 32 computation units, said memory having a width of 32 bits.

The module being able to implement a set of neurons it performs for example neuronal computations or signal digital processings, said memory storing at least results of the computations, coefficients of filters or of convolution products and synaptic coefficients.

The subject of the invention is also a circuit able to implement a neural network, characterized in that it comprises at least one series of signal processing modules able to implement a set of neurons such as that described above.

The signal processing modules are for example grouped together as branches, a branch being formed of a groups of modules and of a dissemination bus, said modules being connected to said bus, a routing block linked to the dissemination buses of said branches performing at least the routing and the dissemination of the input and output data of said circuit to and from said branches.

BRIEF DESCRIPTION OF THE DRAWINGS

Other characteristics and advantages of the invention will become apparent with the aid of the description which follows offered in relation to appended drawings which represent.

DETAILED DESCRIPTION

Figure 1:
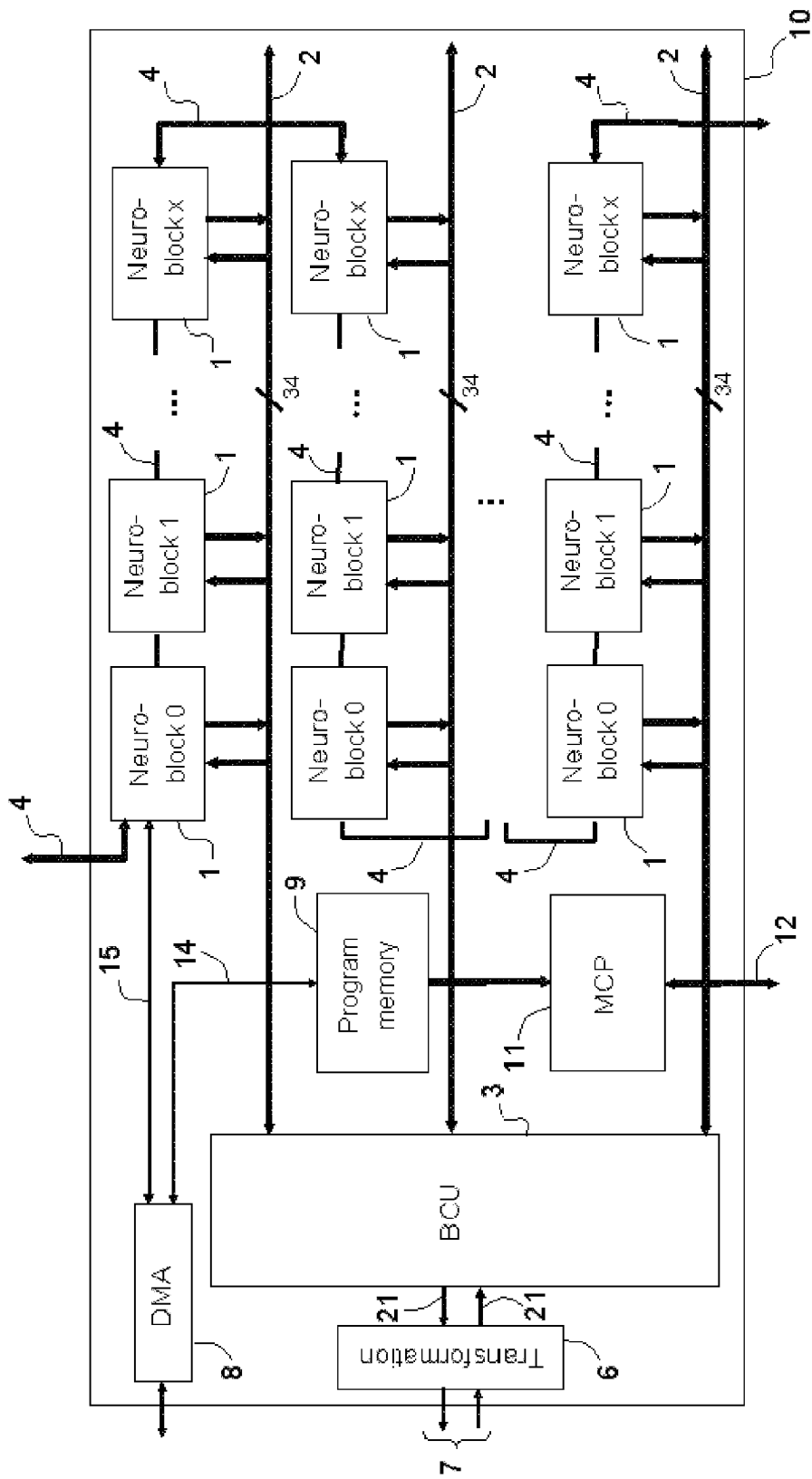
FIG. 1, an exemplary neuronal system comprising a series of elementary processing modules called hereinafter neuro-blocks.

FIG. 1 illustrates by way of example a neuronal system comprising a series of neuro-blocks. The invention is described by way of example in respect of a signal processing module applied to neural networks, but it can apply in respect of other types of processings.

In the example of FIG. 1, the system 10 comprises 32 neuro-blocks 1. A neuro-block can be considered to be the base element since it is able to implement a set of neurons. As indicated previously, a neuron of order i carries out a function of the type:

$$R_i = f\left(\sum_j w_{ij} E_j\right)$$

$w_{ij}$ and $E_j$ being respectively the synaptic weights associated with the neuron and its inputs and f generally being a nonlinear function.

In the exemplary layout of FIG. 1, the neuro-blocks 1 are distributed as branches. A branch is composed of several neuro-blocks 1 and of a dissemination bus 2 that are shared by the neuro-blocks linked to this bus. In a configuration with 32 neuro-blocks for example, the neuro-blocks can be distributed as 4 branches of 8-neuro-blocks or as 8 branches of 4 neuro-blocks.

Moreover, all the neuro-blocks are for example linked by an interconnection line 4 having the structure of a daisy chain bus. More precisely, the arithmetic and logic units (ALU) of each neuro-block can be wired up to this bus. Thus the interconnection line 4 "inter-ALU" passes through all the neuro-blocks 1 of one and the same circuit 10.

Each branch is linked to a routing block 3, the exchanges between the various branches being done via this block 3. This routing block 3 moreover receives input data and transmits data as circuit output for example via a module for transforming the input/output data 6.

A direct memory access module 8 (DMA) allows an expansion of the available memory. It is coupled via buses 14, 15 to an internal memory 9, containing a program, and perhaps linked to each neuro-block 1, more particularly to the memory management unit of each neuro-block.

A control module 11 functions as centralized control processor.

The exemplary neuronal system of FIG. 1 is used by way of example to illustrate a context of use of neuro-blocks. A processing module, or neuro-block, according to the invention can of course apply in respect of other architectures of neuronal systems.

Figure 2:
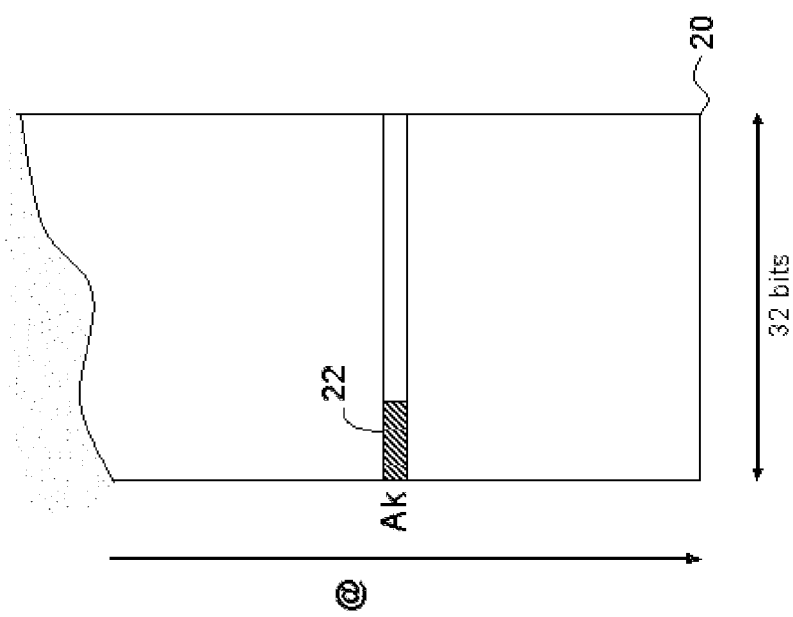
FIG. 2, the storage of the data (synaptic weights, inputs, etc.) in a memory.

FIG. 2 illustrates a problem which arises in respect of a signal processing module, in particular of the neural network type. More particularly, FIG. 2 presents a memory 20 used in a neuro-block. This is a commonplace memory which stores several types of data. In particular it stores the weights of the synapses, coefficients of signal processing filters, in particular carrying out convolution products or Fourier transforms, final or intermediate computation results, as well as other possible data.

A neuro-block performs very many computations with possibly varying precision. For example in the case of on-line learning, it is possible in particular to distinguish the learning phase, in which the synaptic weights are computed, requiring high precision, for example on 16 bits or 32 bits, and the operational phase which requires lower precision, for example on 8 bits. In any event, the variability of the precision used leads to operations being performed in particular on 4 bits, 8 bits, 16 bits or 32 bits or indeed more and even, conversely, on a single bit.

FIG. 2 presents a simple example where a word 22 of 4 bits is stored in the memory 20 at a given address, Ak. In this memory having a width of 32 bits, it is seen that the space is poorly occupied. This case illustrates inefficient use of the silicon. By way of example, in a case where the addresses of the memory 20 are coded on 12 bits, the memory has 4096 addresses. For a width of 32 bits, it can then contain 16 kilo-bytes, or more precisely 16384 bytes. In the conventional solutions of the prior art, this available space of 16 kilo-bytes is for example used to 50%, or indeed less if the data are not exact multiples of the width of the memory.

Figure 3:
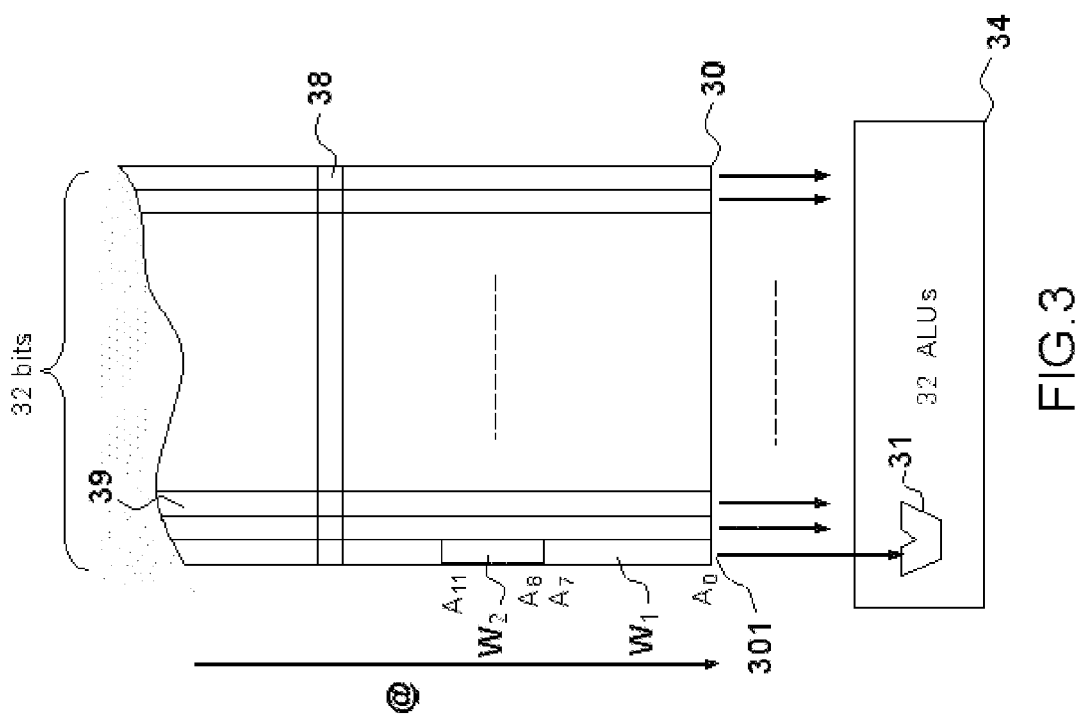
FIG. 3, a possible mode of operation of a signal processing module according to the invention.

FIG. 3 illustrates the mode of operation of a neuro-block according to the invention, more particularly FIG. 3 illustrates the mode of storage of the data in the memory 30 of the neuro-block and the mode of transfer to the arithmetic and logic units 31 (ALU). Instead of storing the data by addresses as in the case of FIG. 2, they are stored over several addresses. The example of FIG. 3 illustrates a preferential case where the data are stored on one bit per address, the whole of the data word being stored on several successive addresses. A word W1 of 8 bits is for example stored on the first bit 301 of the memory between the addresses $A_0$ and $A_7$. Another word W2 of 4 bits is for example stored between the addresses $A_8$ and $A_{11}$. By considering the memory to be a set of rows 38, each corresponding to an address, and of columns 39, each having a width of one bit, the memory is filled column by column. Stated otherwise the memory is organized in such a way that each item of data is stored column-wise on several successive addresses from the low-order bit to the high-order bit for example. The filling is thus transposed with respect to a conventional solution where the memory is filled row by row. In the example of FIG. 3, the ranks of the bits increase with the addresses. The reverse is possible, the highest address of the word then containing the low-order bit. Moreover, the words are transferred in series to an operational computation unit 34, for example consisting of a set of ALUs 31. A data word is thus tagged according to the rank that it occupies width-wise and the addresses that it occupies column-wise. The word W2 thus occupies the first bit between the addresses $A_8$ and $A_{11}$.

The transposed filling of the memory, such as described above, combined with the series transfer of the data, makes it possible to optimize the available memory space.

The storage structure of a module according to the invention, such as illustrated by FIG. 3 affords another advantage. It makes it possible in particular to accelerate certain computations. Because of the "series" type storage inside the memory, it is possible to read a word in either direction. More precisely, the data can be transferred to the computation units starting from the low-order bit, LSB (Least Significant Bit), or starting from the high-order bit, MSB (Most Significant Bit). According to the operations, it is possible to choose a transfer in one direction rather than in the other. Thus for a computation of the maximum between two binary numbers, it is advantageous from the point of view of speed of computation to perform a transfer on the basis of the MSB, the comparisons beginning with the high-order bit. Indeed, if the first item of data has its MSB set to 0 and the second its MSB set to 1, the computation unit can immediately conclude that the second item of data is the larger of the two if the codings are unsigned. On the contrary, for an addition, it is more advantageous to begin the transfer with the LSB, for the propagation of the carry.

FIG. 3 illustrates an embodiment where the bits are transferred directly to the ALU 31, the transfers being performed one column per ALU for example. In the case of an application to 32 ALUs with a memory width of 32 bits, one bit rank is assigned to each ALU.

In the example of FIG. 3, the words are stored on several successive addresses in increasing order. They can of course be stored in decreasing order or disordered if necessary. Moreover, the storage addresses are not necessarily successive, there may indeed be address jumps. In fact, the order and the succession depend in particular on the application.

Figure 4:
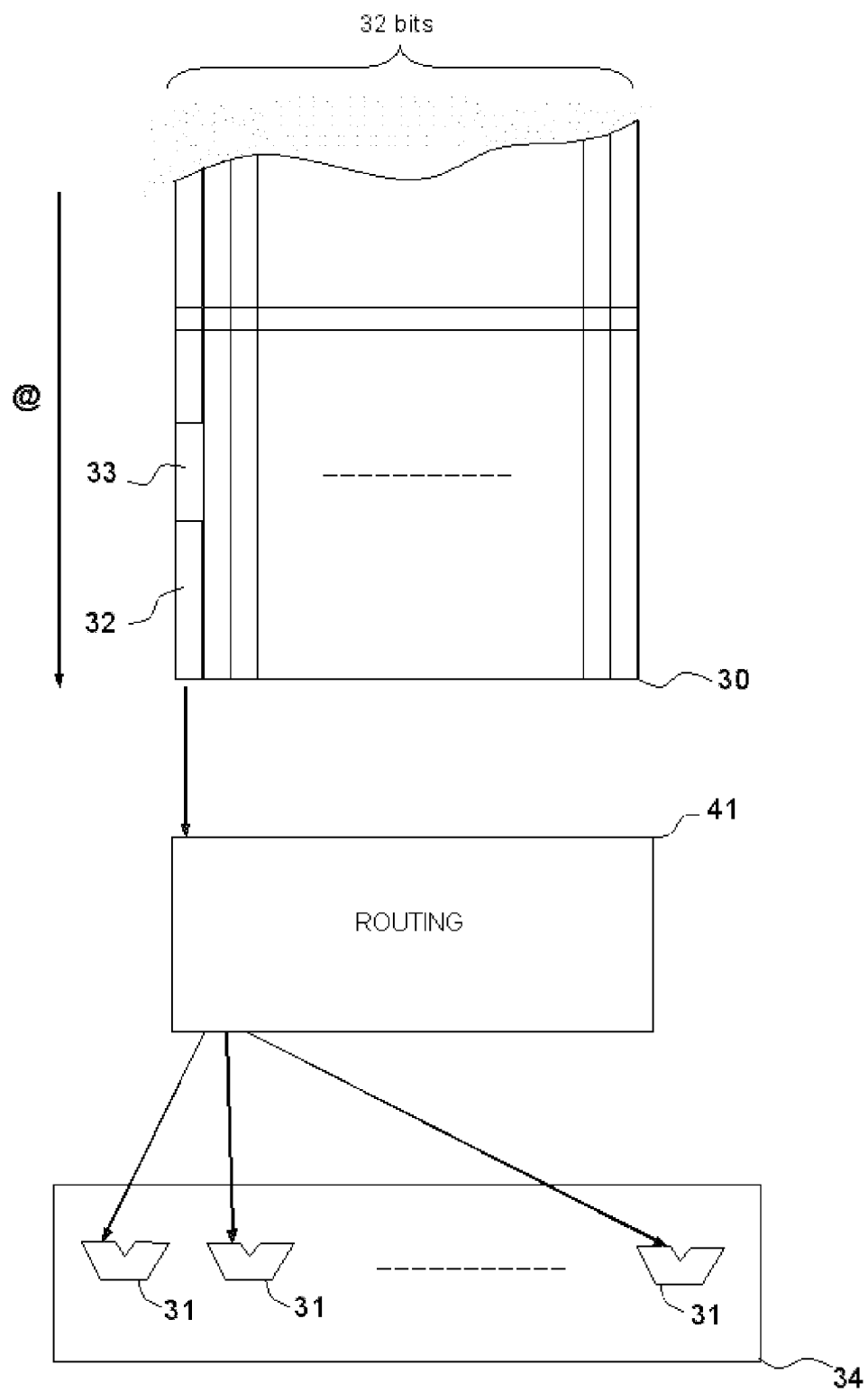
FIG. 4, another possible mode of operation of a module according to the invention.

FIG. 4 presents a more optimal embodiment where the series words are transferred via a routing unit 41. This routing unit makes it possible to further improve the use of the memory space. This unit makes it possible in particular to route, or disseminate, a data word toward one or more circuits, in particular toward one or more ALUs 31. Thus for example, a synaptic weight stored in the memory 30 can be transferred to several ALUs 31 each forming a computation unit. In particular the filters, convolution products or other types of operations specific to neural networks, have some data in common. Stated otherwise, these data are shared between several operations, for example, one and the same filter is used on several pixels of one and the same image in a convolution operation. In the absence of the routing unit 41, the aforementioned synaptic weight ought to be stored at several sites in the memory (for example on each column) so as to be transferred to the ALUs which need it. The dissemination effected by the routing unit thus avoids multiple assignments or copies in the memory 30, a shared item of data being able to be stored at a single site in the memory.

Aside from the dissemination function described above, the routing unit 41 can carry out other functions. This unit 41 can for example also perform the following operations:
Shifting of the bits of the data words (in either direction); for example to facilitate so-called sliding window computations.
Logical operations;
Expansion of the words according to various scales by inserting for example one or more "0"s between all the bits of a word.

The routing unit 41 is for example composed of multiplexers, of registers and logic gates so as to carry out the various data transformation and routing operations. These elements are arranged, in a known manner, in such a way that the operations of routing and transformation, between the memory 30 and the operational unit 34, can be carried out in a single cycle.

Figure 5:
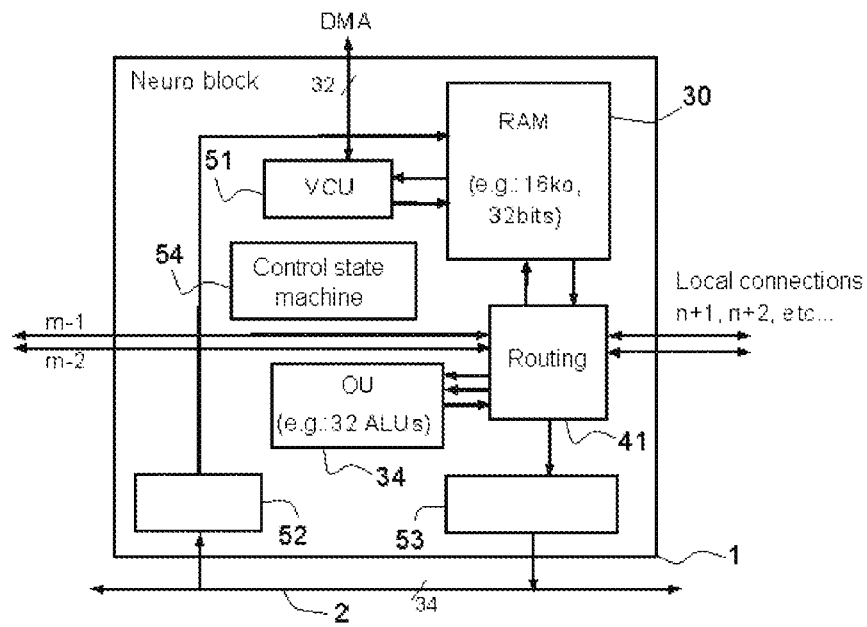
FIG. 5, a possible exemplary embodiment of a module according to the invention.

FIG. 5 presents a possible exemplary embodiment of a signal processing module according to the invention. The module comprises a memory 30, a routing unit 41 and an operational unit 34 arranged and operating in accordance with the description of FIG. 4.

The memory 30 is for example a memory of the RAM type having a capacity of 16 kilo-bytes for a width of 32 bits. As indicated previously, it is in particular intended to store diverse data such as input data, results, intermediate results, coefficients of filters or of convolution products for preprocessing as well as synaptic coefficients.

As in the previous examples, the operational unit 34 comprises 32 ALUs. It carries out all the computations required inside the neuro-block, in particular to perform preprocessings and neuronal processings at one and the same time. The operations which can be implemented are for example the following:
Addition and subtraction;
Multiplication and division;
Calculation of minimum and maximum;
Numerical computation by coordinate rotation (CORDIC) for trigonometric or hyperbolic functions.

The ALUs can operate on operands originating from various sources. A first source of data is of course the memory 30, via the routing unit 41. The operands can also originate from other modules 1 when the module is implemented in a system, for example a neuronal system of the type of FIG. 1. The transfers between the modules may be done for example by the routing unit 41. The latter performs for example in the module of rank n a local interconnection with the neighboring modules, for example with the modules of rank n−2, n−1, n+1 and n+2.

The module 1 is moreover able to be connected to an external bus 2, for example of the type of the dissemination bus of the neuronal system of FIG. 1, via input and output interfaces 52, 53 which will be described subsequently.

The neuro-block comprises for example a memory virtualization and neural network topology management unit 51 (VCU) allowing the virtualization of the memory of the neuro-block and the implementation of the various topologies of neural networks. This unit 51 employs direct and independent access to the memory 30, in read and write mode.

The unit VCU 51 can also ensure global connectivity between the ALUs 34. For this purpose, it possesses a certain number of operators making it possible to reorganize the data stored in memory 30, by duplication or change of order for example (reading of an item of data and writing to another address). It also makes it possible to reorganize the data in memory, for example to replace data which are no longer useful with useful data, allowing for example, the routing unit and the set of ALUs 34 to do the same sequence of operations with the same operand addresses in the memory 30, but with new useful data. The data thus reorganized are ready to be used by the routing unit 41 and the operational unit 34. The unit VCU 51 is moreover linked to a direct memory access (DMA) module outside the neuro-block via a 32-bit bus for example. It can thus read entire blocks in the memory 30 so as to dispatch them to an external memory or write entire blocks to the memory 30 coming from an external memory. The unit VCU 51 thus makes it possible to virtualize the memory containing the synaptic weights, in fact it allows virtualization of the synaptic weights outside the neuro-block.

The neuro block 1 comprises for example an input module 52 and an output module 53 allowing the connection of the neuro-block to the dissemination bus. In particular, they manage the asynchronism (or in any event the absence of synchronization) between the various modules linked via the dissemination bus 2. In the case of application of FIG. 1, the various modules are, in particular, the other neuro-blocks and, in a silicon implementation, the fact of not forcing the synchronization of the neuro-blocks (that is to say not having an entirely synchronous circuit) will make it possible to gain in terms of operating frequency and to simplify the modular realization independently of the number of neuro-blocks.

The input module 52 possesses a unique address specific to the neuro-block but possibly reassignable. It monitors in particular the control words of the messages traveling over the dissemination bus: if the neuro-block identifier situated in the header of the message (Neuro-block ID) corresponds to the actual address of the input module 52 or if this identifier corresponds to a dissemination operation, the module captures the whole set of data of the message and stores them in the memory 30 at addresses previously given by the internal program of the neuro-block according to the mode of addressing described in relation to FIG. 3. The output module 53 is equipped for example with a FIFO memory which manages the waiting on account of the TDMA protocol, if the latter is for example used to access the dissemination bus in particular. According to the type of data item, the module 53 may generate a control flit. It locally stores n sequences of 32 bits for example before dispatching them over the dissemination bus, according to the protocol used.

Advantageously, the TDMA protocol can be combined with the use of the memory 30 by the various resources 51, 41, 52. Indeed, on the one hand the TDMA protocol makes it possible to divide the time into slots, each module internal to the neuro-block having a dedicated slot (for example, a first time slot being reserved for the VCU 51, a second for the routing system 41 linked to the ALUs 34, a third for the input module 52, etc.).

A block 54, for example an SIMD (Single Instruction Multiple Data) controller with 32 pathways, performs the control of the transfers inside the neuro-block according to a conventional process, known to the person skilled in the art. Moreover, each ALU 31 making up the block 34 is for example controlled by a guard bit, whose state depends on the data to be processed. This guard bit can also be controlled by the block 54. This guard bit allows conditional execution of the operations by the ALUs 31, an ALU executing or not executing an operation dispatched by the block 54 as a function of the value of the guard bit (this guard bit making it possible to disregard the result of the operation if necessary for example).

Figure 6:
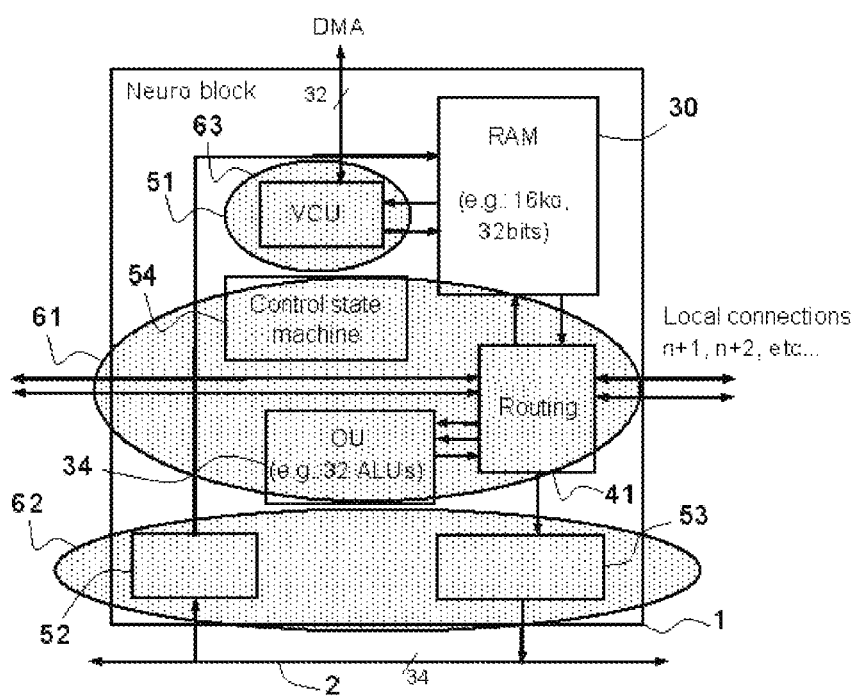
FIG. 6, an exemplary manner of operation of a module according to the invention with several independent synchronizations.

FIG. 6 illustrates the various synchronization areas, or clock areas, inside a neuro-block. These various synchronization areas 61, 62, 63 characterize the decoupling of the computations, of the "long distance" communications and of the virtualization. Stated otherwise a first synchronization frequency 61 regulates the computations performed by the operational unit 34, a second synchronization frequency 62 regulates the communications to the dissemination bus via the inputs/output modules 52, 53 and a third synchronization frequency 63 regulates the operation of the memory virtualization unit 51. These three synchronization areas are independent and the synchronization frequencies can vary over time, for example to adapt to the processing speed appropriate to each area in the course of time.

A module according to the invention allows, in particular, efficient implementation of processings and networks on silicon. The series architecture inside the module and the organization of the storage in the memory 30 allows variable precision to within a bit while optimizing memory occupancy as well as computation time. The invention thus makes it possible to use all the storage resources.

The decoupling afforded by the various synchronization areas affords the following advantages in particular: increase in the operating frequency of the circuit during implementation, possible variation of the operating frequencies of the neuro-blocks in an independent manner so as to optimize energy consumption, etc. And it makes it possible to decouple the programming of the various parts in the various synchronization areas, thus facilitating the development of applications and the scalability of the architecture proposed according to the various possible realizations (variation of the number of neuro-blocks, of the realization of the communication protocols of the units 52 and 53 etc.).

The invention claimed is:

1. A signal processing module, comprising:
  a memory and at least one operational unit incorporating an amount of computation units, wherein input and output interfaces are able to be linked to a bus and the memory storing data destined for said computation units; and
  a routing unit connected between said memory and the at least one operational unit,
  wherein said memory (i) comprises a plurality of columns and (ii) is organized in such a way that each of a plurality of data words is stored column-wise over several addresses, the columns each having a width of one bit, the words being transferred in series to said computation units,
  wherein an amount of the columns is determined based on the amount of the computation units, wherein the signal processing module implements a set of neurons, and wherein said routing unit (i) has a number of inputs at least equal to a number of a width in bits of said memory and (ii) is configured to receive, via each of the inputs, data from only a single column of the memory and to route the data words between said memory and the computation units, one and the same word being able to be routed to a plurality of the computation units.

2. The signal processing module as claimed in claim 1, wherein each data word is stored column-wise over several addresses according to an order dependent on the application using said data.

3. The signal processing module as claimed in claim 2, wherein said several addresses comprise address jumps.

4. The signal processing module as claimed in claim 1, wherein each of the computation units is an arithmetic logic unit (ALU).

5. The signal processing module as claimed in claim 1, wherein the routing unit comprises at least two other series of inputs/outputs able to be linked to circuits outside said module.

6. The signal processing module as claimed in claim 5, wherein said inputs/outputs are able to be linked as inputs and outputs of the routing unit of another module identical to said module.

7. The signal processing module as claimed in claim 1, wherein the routing unit performs all or part of the following operations: shifting of the bits of the data words; logical operations; expansion of the words.

8. The signal processing module as claimed in claim 1, comprising a memory virtualization unit linked on the one hand in write and read mode to said memory and on the other hand to an external memory via a circuit of DMA type.

9. The signal processing module as claimed in claim 8, wherein the memory virtualization unit performs operations of reorganization of said memory.

10. The signal processing module as claimed in claim 9, wherein the operations of reorganization of said memory are done by duplication or change of order of the data between the columns of said memory.

11. The signal processing module as claimed in claim 1, wherein the input and output interfaces communicate with said bus by a TDMA protocol.

12. The signal processing module as claimed in claim 7, comprising a memory virtualization unit linked on the one hand in write and read mode to said memory and on the other hand to an external memory via a circuit of DMA type, wherein said memory allows independent accesses in read and write mode for the input interfaces, the virtualization unit and the routing unit.

13. The signal processing module as claimed in claim 1, wherein it operates according to several independent synchronous zones, the operational unit operating in a first clock area, the input interface and the output interface operating in a second clock area.

14. The signal processing module as claimed in claim 13, comprising a memory virtualization unit linked on the one hand in write and read mode to said memory and on the other hand to an external memory via a circuit of DMA type, wherein the memory virtualization unit operates in a third independent clock area.

15. The signal processing module as claimed in claim 1, wherein the computation units execute the operations as a function of the value of a guard bit assigned to each of said units.

16. The signal processing module as claimed in claim 1, wherein the operational unit comprises at least 32 computation units, said memory having a width of 32 bits.

17. The signal processing module as claimed in claim 1, wherein the signal processing module is able to perform neuronal computations or signal digital processings, said memory storing at least results of the computations, coefficients of filters or of convolution products and synaptic coefficients.

18. A circuit able to implement a neural network, comprising at least one series of signal processing modules as claimed in claim 17.

19. The circuit as claimed in claim 18, wherein the signal processing modules are grouped together as branches, a branch being formed of a group of modules and of a dissemination bus, said modules being connected to said bus, a routing block linked to the dissemination buses of said branches performing at least routing and dissemination of the input and output data of said circuit to and from said branches.

* * * * *